US008390611B2

(12) United States Patent
Hsueh et al.

(10) Patent No.: US 8,390,611 B2
(45) Date of Patent: Mar. 5, 2013

(54) IMAGE DISPLAY SYSTEM AND GATE DRIVER CIRCUIT

(75) Inventors: Fu-Yuan Hsueh, Bade (TW); Tzu-Yu Cheng, Dali (TW)

(73) Assignee: Chimei Innolux Corporation, Miao-Li County (TW)

( * ) Notice: Subject to any disclaimer, the term of this patent is extended or adjusted under 35 U.S.C. 154(b) by 269 days.

(21) Appl. No.: 12/856,946

(22) Filed: Aug. 16, 2010

(65) Prior Publication Data

US 2011/0043511 A1 Feb. 24, 2011

Related U.S. Application Data

(60) Provisional application No. 61/234,970, filed on Aug. 18, 2009.

(30) Foreign Application Priority Data

May 31, 2010 (TW) ................................ 99117381 A

(51) Int. Cl.

| | |
|---|---|
| ***G06F 3/038*** | (2006.01) |
| ***G09G 5/00*** | (2006.01) |
| ***G09G 3/36*** | (2006.01) |
| ***G11C 19/00*** | (2006.01) |

(52) U.S. Cl. .............. 345/212; 377/64; 377/70; 377/75; 345/98; 345/100

(58) Field of Classification Search .......... 345/204–215, 345/690–699; 377/64–81
See application file for complete search history.

(56) References Cited

U.S. PATENT DOCUMENTS 7,106,292 B2 * 9/2006 Moon ........................... 345/100
7,154,488 B2 * 12/2006 Morita .......................... 345/204

* cited by examiner

*Primary Examiner* — Dwayne Bost
*Assistant Examiner* — Larry Sternbane
(74) *Attorney, Agent, or Firm* — McClure, Qualey & Rodack, LLP

(57) ABSTRACT

An image display system includes a gate driving circuit. The gate driving circuit includes several stages of gate drivers each for generating a gate driving signal to drive a row of pixels. Each stage of the gate driver receives a clock signal and a first reset signal. A first stage of the gate driver receives a vertical start pulse as an input signal of the first stage. The remaining stages of the gate drivers respectively receive the gate driving signal generated by a previous stage of the gate driver as the input signal of the remaining stages. Each stage of the gate drivers further receives the gate driving signal generated by a next stage of the gate driver as a second reset signal, and generates the corresponding gate driving signal according to the clock signal, the first reset signal, and the corresponding input signal and second reset signal.

10 Claims, 5 Drawing Sheets

IMAGE DISPLAY SYSTEM AND GATE DRIVER CIRCUIT

CROSS REFERENCE TO RELATED APPLICATIONS

This application claims the benefit of U.S. Provisional Application No. 61/234,970, filed Aug. 18, 2009 and entitled "NOVEL STATIC GATE DRIVER IN NARROW LEDGE APPLICATION", and also claims priority of Taiwan Patent Application No. 99117381, filed on May 31, 2010. The entire contents of which are hereby incorporated by reference.

BACKGROUND OF THE INVENTION

1. Field of the Invention

The invention relates to an image display system, and more particularly to a gate driver in an image display system.

2. Description of the Related Art

FIG. 1 shows a conventional gate driver circuit, which includes a plurality of gate drivers 101 and logic circuits 102 for generating gate driving signals G1, G2 . . . GN for each stage of the gate drivers according to a vertical start pulse STV or a gate driving signal output from a previous stage of the gate driver and a control signal ENBV signal. FIG. 2 shows a detailed circuit of the conventional gate driver shown in FIG. 1. As show in FIG. 2, the gate driver 101 includes at least 25 transistors (including the transistors in the inverters and the logic gates). However, because a huge amount of transistors are used in the conventional gate driver, the circuit area required by the gate driver is large. Thus, conventional gate drivers are not suitable for developing a narrow ledged display panel, or borderless display panel.

Therefore, a novel gate driver circuit is highly required, which has a greatly reduced amount of transistors, has stable gate driving signal output and can be applied to a narrow ledged display panel and borderless display panel,

BRIEF SUMMARY OF THE INVENTION

An image display system and gate driver circuit are provided. An exemplary embodiment of an image display system comprises a gate driver circuit. The gate driver circuit comprises a plurality of stages of gate drivers, each for generating a gate driving signal to drive a row of pixels in a pixel array. Each stage of the gate driver receives a clock signal and a first reset signal. A first stage of the gate driver receives a vertical start pulse as an input signal of the first stage. The remaining stages of the gate drivers respectively receive the gate driving signal generated by a previous stage of the gate driver as the input signal of the remaining stages. Each stage of the gate drivers further receives the gate driving signal generated by a next stage of the gate driver as a second reset signal. Each stage of the gate drivers generates the corresponding gate driving signal according to the clock signal, the first reset signal, and the corresponding input signal and second reset signal.

An exemplary embodiment of a gate driver circuit comprises a plurality of stages of gate drivers, each for generating a gate driving signal to drive a row of pixels in a pixel array. Each stage of the gate driver receives a clock signal and a first reset signal. A first stage of the gate driver receives a vertical start pulse as an input signal of the first stage. The remaining stages of the gate drivers respectively receive the gate driving signal generated by a previous stage of the gate driver as the input signal of the remaining stages. Each stage of the gate drivers further receives the gate driving signal generated by a next stage of the gate driver as a second reset signal. Each stage of the gate drivers generates the corresponding gate driving signal according to the clock signal, the first reset signal, and the corresponding input signal and second reset signal.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3:
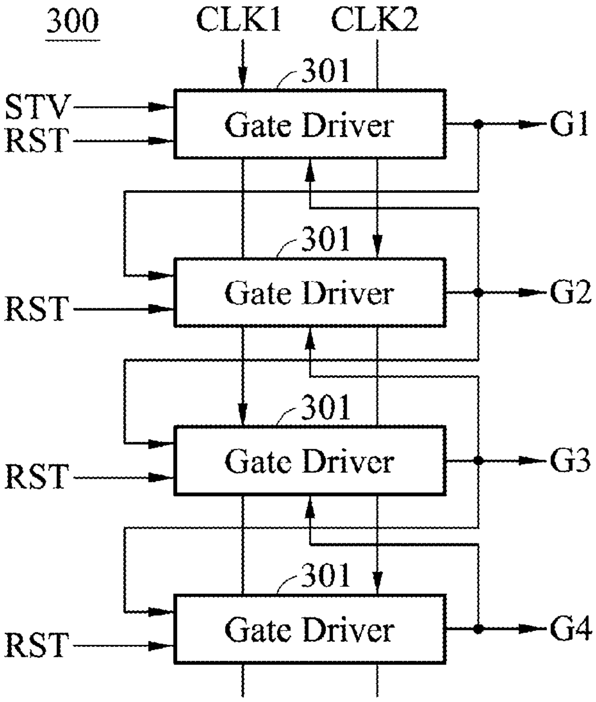
FIG. 3 shows a gate driver circuit according to an embodiment of the invention.

FIG. 3 shows a gate driver circuit according to an embodiment of the invention. As shown in FIG. 3, the gate driver circuit 300 comprises a plurality of stages of gate drivers 301, each for generating a gate driving signal G1, G2, . . . GN according to the vertical start pulse STV or the gate driving signal output from a previous stage of the gate driver. Note that for illustrative simplicity, only four stages of the gate drivers are shown in FIG. 3. However, the scope and spirit of the invention can also be applied to a gate driver circuit with more or less than four stages of the gate drivers, and the invention should not be limited thereto. Those who are skilled in this technology can still make various alterations and modifications without departing from the scope and spirit of this invention. Therefore, the scope of the present invention shall be defined and protected by the following claims and their equivalents.

Figure 10:
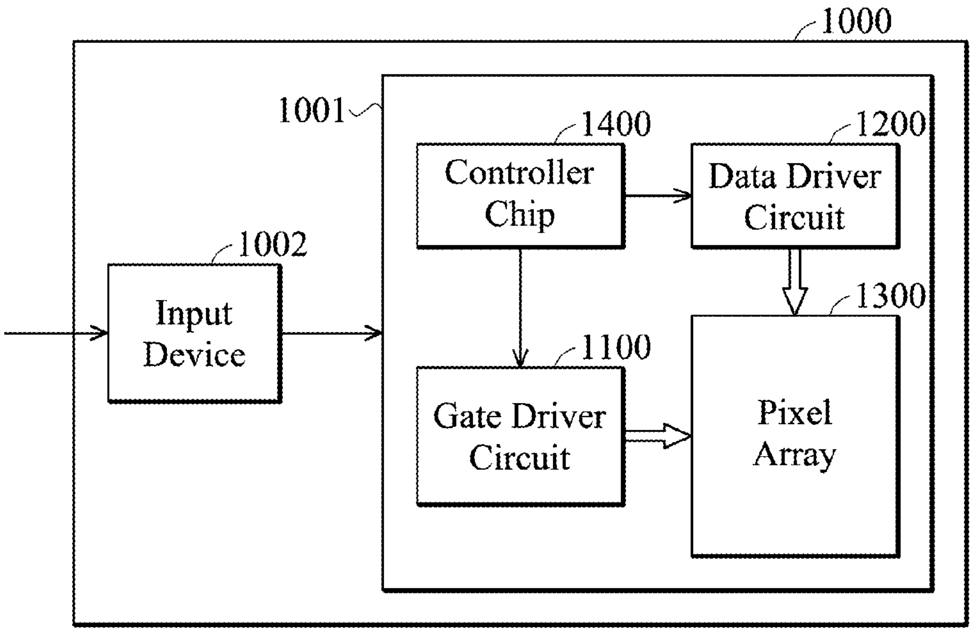
FIG. 10 shows one of the various types of image display systems of the invention according to an embodiment of the invention.

As shown in FIG. 3, each stage of the gate drivers generates a gate driving signal G1-G4 to drive a row of pixels in a pixel array 1300 (shown in FIG. 10). The gate driver circuit 1100 (which may be implemented as the gate driver circuit 300 shown in FIG. 3 or the gate driver circuit 800 shown in FIG. 8) receives the clock signals CLK1 and CLK2 and a first reset signal RST from a controller chip 1400 (shown in FIG. 10), wherein the clock signals CLK1 and CLK2 are respectively provided for odd and even stages of the gate drivers 301. A first stage of the gate driver receives the vertical start pulse STV from the controller chip 1400 (shown in FIG. 10) as an input signal of the first stage. The remaining stages of the gate drivers respectively receive the gate driving signal (for example, G1-G3) generated by a previous stage of the gate driver as the input signal of the remaining stages. According to an embodiment of the invention, each stage of the gate drivers further receives the gate driving signal (for example, G2-G4) generated by a next stage of the gate driver as a second reset signal. Therefore, in the embodiments of the invention, each stage of the gate drivers 301 generates the corresponding gate driving signal G1-G4 according to the clock signal CLK1 or CLK2, the first reset signal RST, and the corresponding input signal and the second reset signal. Note that according to an embodiment of the invention, the last stage of the gate driver in the gate driver circuit may be set as a dummy gate driver stage. Therefore, the last stage of the gate driver may receive a specific signal as the corresponding second reset signal, or may not receive any signal as the corresponding second reset signal (as the fourth stage of the gate driver shows in FIG. 3).

Figure 4:
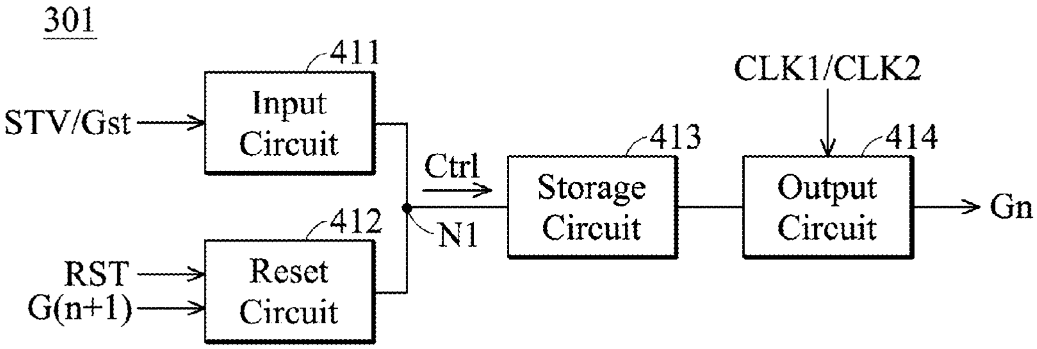
FIG. 4 shows the block diagram of a gate driver according to an embodiment of the invention.

FIG. 4 shows the block diagram of a gate driver according to an embodiment of the invention. As shown in FIG. 4, the gate driver 301 may comprise an input circuit 411, a reset circuit 412, a storage circuit 413 and an output circuit 414. The input circuit 411 receives the input signal. As previously described, the input signal of a first stage of the gate driver is the vertical start pulse STV, and the input signal of the remaining stages of the gate drivers is the gate driving signal generated by a previous stage of the gate driver (represented by the signal GST in FIG. 4). The reset circuit 412 receives the first reset signal RST and the second reset signal G(n+1) (that is, the gate driving signal generated by a next stage of the gate driver). The input circuit 411 and the reset circuit 412 are coupled to a node N1 and generate a control signal Ctrl at the node N1 according to an output signal of the input circuit 411 and the reset circuit 412. The storage circuit 413 is coupled to the node N1 for storing the control signal Ctrl. The output circuit 414 is coupled to the storage circuit 413 for receiving the clock signal CLK1/CLK2 and the control signal Ctrl, and generates the gate driving signal Gn according to the clock signal CLK1/CLK2 and the control signal Ctrl.

According to an embodiment of the invention, the reset circuit 412 may provide a two staged reset function. To be more specific, the reset circuit 412 may reset the control signal Ctrl first (for example, reset voltage of the control signal Ctrl to 0V) during a first time period (for example, when the voltage of the first reset signal RST is high (or low)) according to the first reset signal RST. For example, the reset circuit 412 may reset the control signal Ctrl in the beginning of a scene or when the power of the image display system (as shown in FIG. 10) is turned on, thereby resetting an unknown floating voltage when a system is powered on. In addition, the reset circuit 412 may further reset the control signal Ctrl during a second time period according to the second reset signal G(n+1). For example, the reset circuit 412 may reset the voltage of the control signal Ctrl to 0V when the voltage of the second reset signal G(n+1) is high (or low). In this manner, after a predetermined pulse of the gate driving signal Gn is generated by a corresponding gate driver for driving a corresponding row in the pixel array, the voltage of the gate driving signal Gn can be reset to prevent the gate driving signal Gn from fluctuating with changes in the clock signal CLK1/CLK2.

Figure 5:
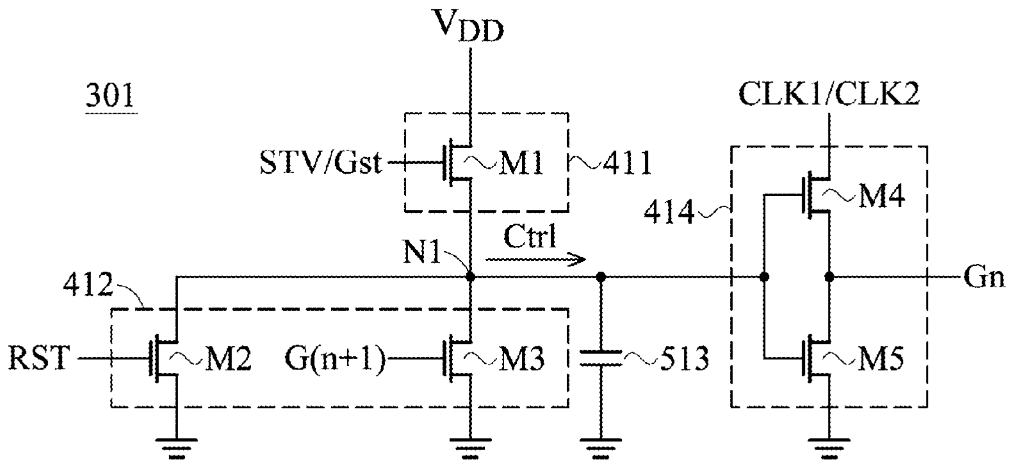
FIG. 5 shows a detailed circuit of the gate driver according to an embodiment of the invention.

FIG. 5 shows a detailed circuit of the gate driver according to an embodiment of the invention. As shown in FIG. 5, the input circuit 411 may comprise a first transistor M1 coupled between a first supply voltage VDD and the node N1 for receiving the input signal STV/Gst. The reset circuit 412 may comprise a second transistor M2 and a third transistor M3. The second transistor M2 is coupled between a second supply voltage (the ground) and the node N1 for receiving the first reset signal RST. The third transistor M3 is coupled between the second supply voltage and the node N1 for receiving the second reset signal G(n+1). According to an embodiment of the invention, the first transistor M1, the second transistor M2 and the third transistor M3 are turned on or off according to the input signal STV/Gst, the first reset signal RST and the second reset signal G(n+1), so as to generate the control signal Ctrl at the node N1 according to the first supply voltage VDD and the second supply voltage (the ground). Voltage of the control signal Ctrl may be high (VDD) or low (ground) according to the ON/OFF statuses of the first transistor M1, the second transistor M2 and the third transistor M3. According to an embodiment of the invention, the storage circuit 413 may be a capacitor 513 coupled between the node N1 and the second supply voltage for storing the control signal Ctrl. The output circuit 414 may comprise a fourth transistor M4 and a fifth transistor M5. The fourth transistor M4 has a first terminal receiving the control signal Ctrl and a second terminal receiving the clock signal CLK1/CLK2 or CKV1/CKV2 (referring to FIG. 8, which will be introduced in the following paragraphs). The fifth transistor M5 has a first terminal receiving the control signal Ctrl and a second terminal coupled to the second supply voltage. According to an embodiment of the invention, the fourth transistor M4 and the fifth transistor M5 are respectively turned on or off according to the control signal Ctrl, so as to generate the gate driving signal Gn according to the clock signal CLK1/CLK2 and the second supply voltage.

Figure 6:
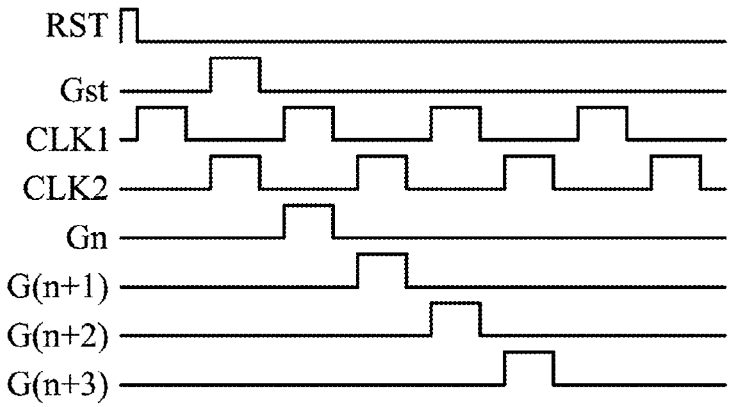
FIG. 6 shows the signal waveforms according to an embodiment of the invention.

FIG. 6 shows the signal waveforms according to an embodiment of the invention. According to an embodiment of the invention, the signal waveforms as shown in FIG. 6 may be obtained when applying the gate driver as shown in FIG. 4, FIG. 5 or FIG. 7 (which will be illustrated in the following paragraphs) to the gate driver circuit as shown in FIG. 3.

Figure 7:
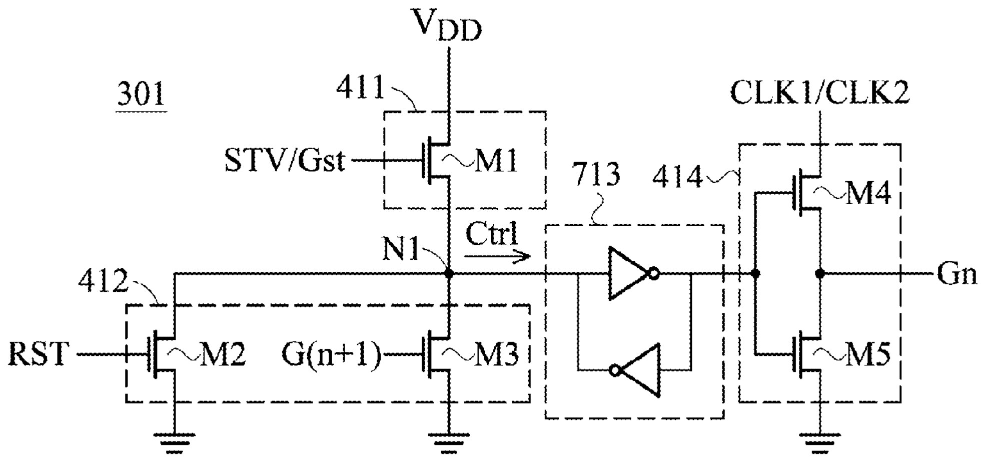
FIG. 7 shows a detailed circuit of the gate driver according to another embodiment of the invention.

FIG. 7 shows a detailed circuit of the gate driver according to another embodiment of the invention. According to another embodiment of the invention, the storage circuit may be a latch 713 for storing the control signal Ctrl. Note that the remaining parts of the gate driver shown in FIG. 7 are the same as those shown in FIG. 5. For descriptions of the operations of the elements in the gate driver, reference may be made to FIG. 5 and corresponding paragraphs, and are omitted here for brevity.

Along with the detailed circuitry of the gate driver shows in FIGS. 5 and 7, and the signal waveforms shown in FIG. 6, an example showing detailed operation of the gate driver circuit will be introduced next. According to an embodiment of the invention, the second transistor M2 may first be turned on according to the voltage of the first reset signal RST, thereby resetting the voltage at node N1 to be low (e.g. the ground). Next, the first transistor M1 is turned on according to the voltage of the input signal STV/Gst (that is, the gate driving signal generated by a pervious stage of the gate driver). When the first transistor M1 is turned on, the voltage at node N1 may become high (e.g. VDD) so as to control the fourth transistor M4 of the output circuit 414 to generate the gate driving signal Gn according to the clock signal CLK1/CLK2. Next, the third transistor M3 may be turned on according to the voltage of the second reset signal G(n+1) (that is, the gate driving signal generated by a next stage of the gate driver). When the third transistor M3 is turned on, the voltage at node N1 may become low (e.g. ground) so as to reset the voltage of control signal Ctrl to 0V, thereby controlling the fifth transistor M5 in the output circuit 414 to reset the voltage of the gate driving signal Gn to low (e.g. ground). In this manner, the voltage of the gate driving signal Gn generated by the gate driver does not always vary with the clock signal CLK1/CLK2 or CKV1/CKV2. The voltage at node N1 may be stored in the storage circuit 413 (for example, the capacitor 513 as shown in FIG. 5 or the latch 713 as shown in FIG. 7) and accordingly transmitted to the output circuit 414. Note that according to the embodiments of the invention, the types of the transistors M1, M2, M3, M4 and M5 may be designed based on the above-mentioned functionality and results. Therefore, the types of the transistors M1, M2, M3, M4 and M5 should not be limited to the N channel or P channel, or any specific types of transistors. In addition, in some embodiments of the invention, the transistors M1, M2, M3, M4 and M5 may also be replaced by the switches, being turned on or off according to the corresponding control signals RST, STV/Gst, G(n+1) and Ctrl and thereby provide the above-mentioned functionalities and results.

Figure 8:
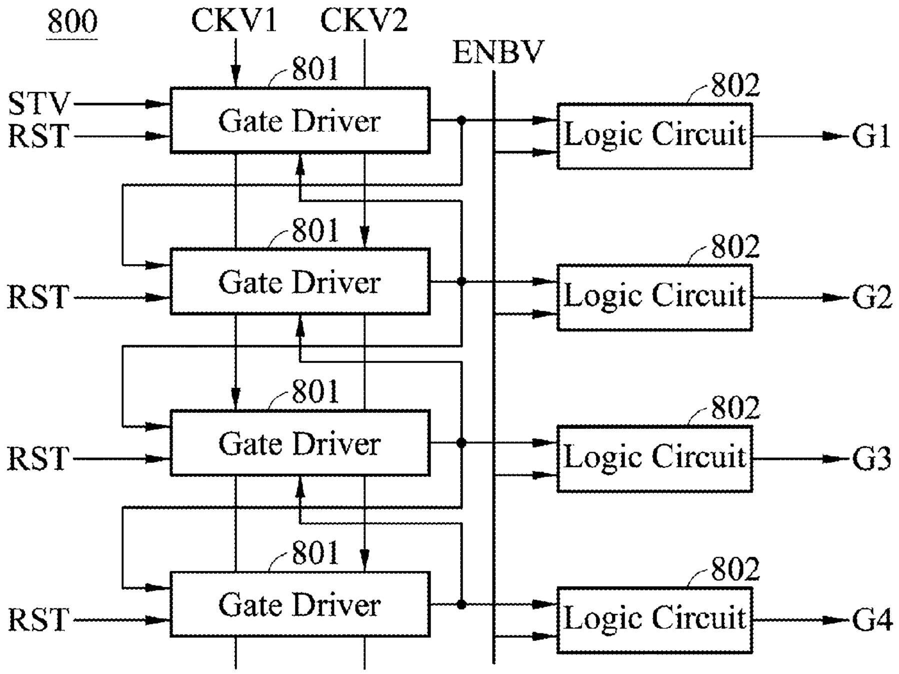
FIG. 8 shows a gate driver circuit according to another embodiment of the invention.

FIG. 8 shows a gate driver circuit according to another embodiment of the invention. Note that the gate driver is also called a Static Latch Gate Driver (SLGD), and can be applied to various gate driver circuit types, such as the gate driver circuit 300 as shown in FIG. 3 and the gate driver circuit 800 as shown in FIG. 8. As shown in FIG. 8, the gate driver circuit 800 comprises a plurality of stages of gate drivers 801 and logic circuits 802, each for generating a gate driving signal G1, G2, G3 or G4 according to the vertical start pulse STV or the gate driving signal output from a previous stage of the gate driver and the control signal ENBV. The logic circuits 802 adequately adjust the pulse width and/or the voltage of the gate driving signal according to the control signal ENBV. Note that for illustrative simplicity, only four stages of the gate drivers are shown in FIG. 8. However, the scope and spirit of the invention can also be applied to the gate driver circuit with more or less than four stages of the gate drivers, and the invention is not limited thereto. Those who are skilled in this technology can still make various alterations and modifications without departing from the scope and spirit of this invention. Therefore, the scope of the present invention shall be defined and protected by the following claims and their equivalents.

As shown in FIG. 8, each stage of the gate drivers generates a gate driving signal G1-G4 to drive a row of pixels in a pixel array 1300 (shown in FIG. 10). The gate driver 801 receives the clock signals CKV1 and CKV2 and a first reset signal RST from a controller chip 1400 (shown in FIG. 10), where the clock signals CKV1 and CKV2 are respectively provided for odd and even stages of the gate drivers 801. A first stage of the gate driver receives the vertical start pulse STV from the controller chip 1400 (shown in FIG. 10) as an input signal of the first stage. The remaining stages of the gate drivers respectively receive the gate driving signal (for example, G1-G3) generated by a previous stage of the gate driver as the input signal of the remaining stages. According to an embodiment of the invention, each stage of the gate drivers further receives the gate driving signal (for example, G2-G4) generated by a next stage of the gate driver as a second reset signal. Therefore, in the embodiments of the invention, each stage of the gate drivers 801 generates the corresponding gate driving signal G1-G4 according to the clock signal CKV1 or CKV 2, the first reset signal RST, and the corresponding input signal and second reset signal. Note that according to an embodiment of the invention, the last stage of the gate driver in the gate driver circuit may be set as a dummy gate driver. Therefore, the last stage of the gate driver may receive a specific signal as the corresponding second reset signal, or may not receive any signal as the corresponding second reset signal (as the fourth stage of the gate driver shows in FIG. 8).

Figure 9:
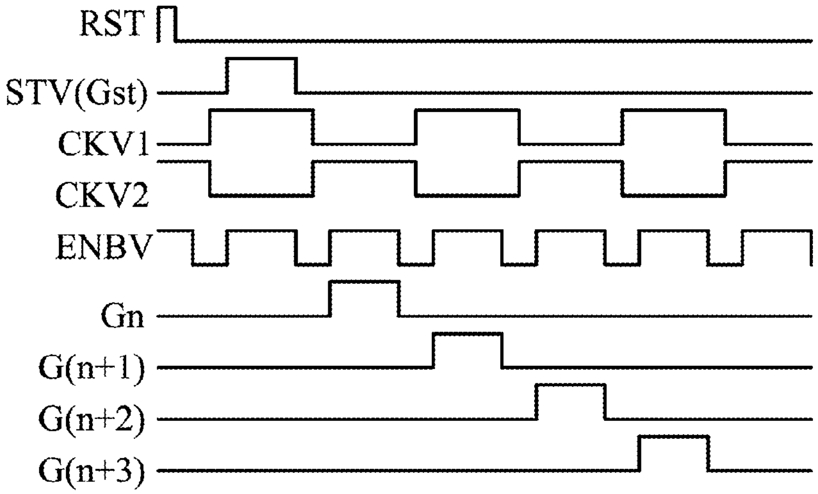
FIG. 9 shows the signal waveforms according to another embodiment of the invention.

According to another embodiment of the invention, the gate driver as shown in FIG. 4, and the detailed circuits of the gate driver as shown in FIG. 5 and FIG. 7 may also be applicable to the gate driver 801 as shown in FIG. 8. For the descriptions of the operations of the elements in the gate driver, reference may be made to corresponding figures and paragraphs, and are omitted here for brevity. FIG. 9 shows the signal waveforms according to another embodiment of the invention. According to an embodiment of the invention, the signal waveforms as shown in FIG. 9 may be obtained when applying the gate driver as shown in FIG. 4, FIG. 5 or FIG. 7 to the gate driver circuit as shown in FIG. 8.

Figure 1:
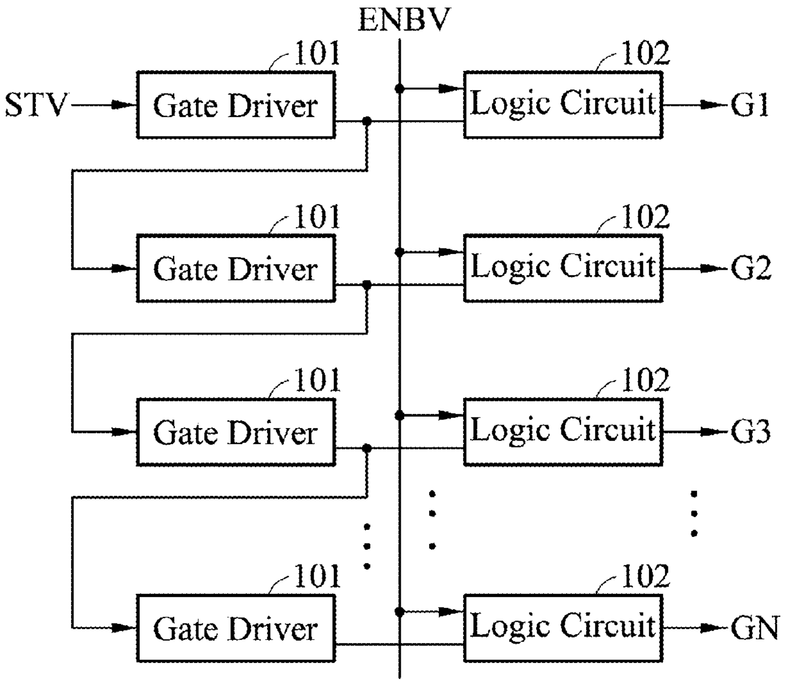
FIG. 1 ( PRIOR ART )
FIG. 1 shows a conventional gate driver circuit.
Figure 2:
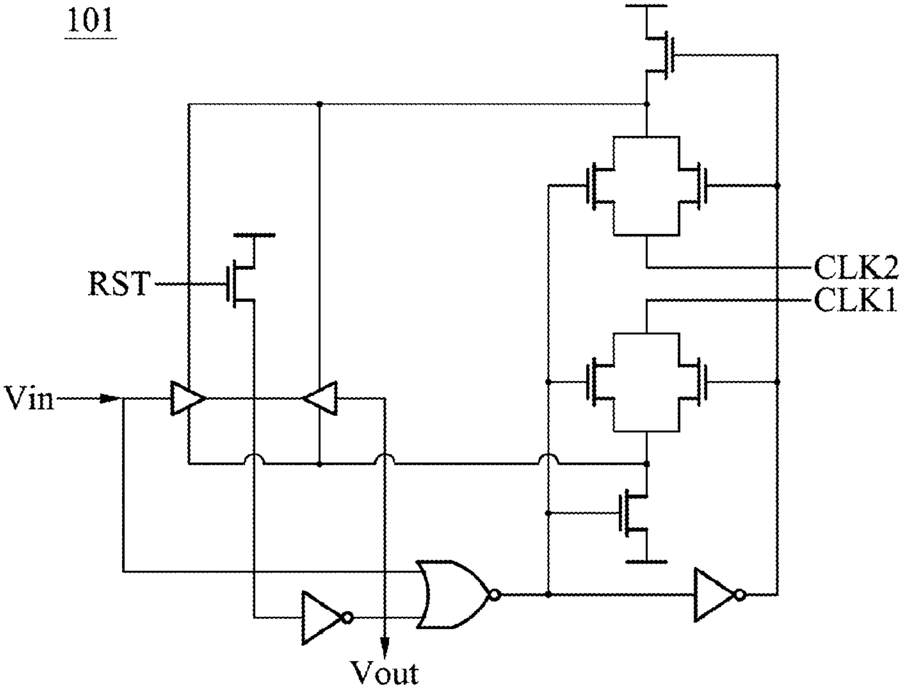
FIG. 2 ( PRIOR ART )
FIG. 2 shows a detailed circuit of the conventional gate driver shown in FIG. 1.

According to the embodiments of the invention, according to the gate drivers shown in the detailed circuit in FIG. 5 and FIG. 7, there are only 5 to 9 transistors (including 4 transistors utilized in the latch) required in the proposed gate driver circuit. Compared with the conventional gate driver as shown in FIG. 2, in which at least 25 transistors are required, the amount of transistors of the proposed gate driver is greatly reduced. The proposed gate driver circuit not only operates with a simplified circuit design, but also provides stable gate driving signals. Therefore, the circuit area required by the gate driver is greatly reduced. In addition, same control signals as the conventional gate driver are required by the proposed gate driver. Therefore, the proposed gate drive can be directly applied in image display systems without additional circuit modifications.

FIG. 10 shows one of the various types of image display systems of the invention according to an embodiment of the invention. As shown in FIG. 10, the image display system may comprise a display panel 1001, where the display panel 1001 may comprise a gate driver circuit 1100, a data driver circuit 1200, a pixel array 1300 and a controller chip 1400, which may be implemented according to the various types of embodiments as previously described. The gate driver circuit 1100 may be implemented according to the gate driver circuit 300 shown in FIG. 3 or the gate driver circuit 800 shown in FIG. 8. The data driver circuit 1200 may comprise a plurality of stages of data drivers, each for generating a data driving signal so as to provide image data to a column of pixels in the pixel array 1300. The controller chip 1400 generates the clock signals CLK1/CLK2 or CKV1/CKV2, the first reset signal RST and the vertical start pulse STV.

In addition, the image display system may further comprise an electronic device 1000. The electronic device 1000 may comprise the above mentioned display panel 1001 and an input device 1002. The input device 1002 receives image signals and controls the display panel 1001 to display images. According to an embodiment of the invention, the electronic device 1000 may be implemented in various devices, comprising: a mobile phone, a digital camera, a personal digital assistant (PDA), a lap-top computer, a personal computer, a television, a vehicle displayer, a portable DVD player, or any apparatus with image display functionality.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An image display system, comprising:

a gate driver circuit, comprising:

a plurality of stages of gate drivers, each for generating a gate driving signal to drive a row of pixels in a pixel array, wherein each stage of the gate driver circuit receives a clock signal and a first reset signal, a first stage of the gate driver circuit receives a vertical start pulse as an input signal of the first stage, the remaining stages of the gate drivers respectively receive the gate driving signal generated by a previous stage of the gate driver circuit as the corresponding input signal of the remaining stages, and each stage of the gate drivers further receives the gate driving signal generated by a next stage of the gate driver circuit as a second reset signal, and wherein each stage of the gate driver comprises:

an input circuit, comprising a first transistor directly coupled between a first supply voltage and a node and receiving the input signal;

a reset circuit, directly coupled to the node and generating a control signal at the node, wherein the reset circuit comprises:

a second transistor, directly coupled between a second supply voltage and the node and receiving the first reset signal; and a third transistor, directly coupled between the second supply voltage and the node and receiving the second reset signal, wherein the first transistor, the second transistor and the third transistor are turned on or off according to the input signal, the first reset signal and the second reset signal, respectively, and the control signal is generated at the node according to the first supply voltage and the second supply voltage;

a storage circuit, directly coupled to the node and comprising a latch for storing the control signal; and an output circuit, directly coupled to the storage circuit and comprising:

a fourth transistor, having a first terminal receiving the control signal and a second terminal receiving the clock signal; and a fifth transistor, having a first terminal receiving the control signal and a second terminal directly coupled to the second supply voltage, wherein the fourth transistor and the fifth transistor are respectively turned on or off according to the control signal, and the gate driving signal is generated according to the clock signal and the second supply voltage.

2. The image display system as claimed in claim 1, further comprising a display panel, wherein the display panel comprises:

the gate driver circuit;

the pixel array; and a controller chip, for generating the clock signal, the first reset signal and the vertical start pulse.

3. The image display system as claimed in claim 2, further comprising an electronic device, wherein the electronic device comprises:

the display panel; and an input device, receiving signals to control the display panel to display images.

4. The image display system as claimed in claim 3, wherein the electronic device is a mobile phone, a digital camera, a personal digital assistant (PDA), a lap-top computer, a personal computer, a television, a vehicle displayer, or a portable DVD player.

5. The image display system as claimed in claim 1, wherein the reset circuit resets the control signal during a first time period according to the first reset signal and the second supply voltage, and resets the control signal during a second time period according to the second reset signal and the second supply voltage.

6. A gate driver circuit, comprising:

a plurality of stages of gate drivers, each for generating a gate driving signal to drive a row of pixels in a pixel array, wherein each stage of the gate driver circuit receives a clock signal and a first reset signal, a first stage of the gate driver circuit receives a vertical start pulse as an input signal of the first stage, the remaining stages of the gate drivers respectively receive the gate driving signal generated by a previous stage of the gate driver circuit as the input signal of the remaining stages, and each stage of the gate drivers further receives the gate driving signal generated by a next stage of the gate driver circuit as a second reset signal, and wherein each stage of the gate driver comprises:

an input circuit, comprising a first transistor directly coupled between a first supply voltage and a node and receiving the input signal;

a reset circuit, directly coupled to the node and generating a control signal at the node, wherein the reset circuit comprises:

a second transistor, directly coupled between a second supply voltage and the node and receiving the first reset signal; and a third transistor, directly coupled between the second supply voltage and the node and receiving the second reset signal, wherein the first transistor, the second transistor and the third transistor are turned on or off according to the input signal, the first reset signal and the second reset signal, respectively, and the control signal is generated at the node according to the first supply voltage and the second supply voltage;

a storage circuit, directly coupled to the node and comprising a latch for storing the control signal; and an output circuit, directly coupled to the storage circuit and comprising:

a fourth transistor, having a first electrode receiving the control signal and a second electrode receiving the clock signal; and a fifth transistor, having a first electrode receiving the control signal and a second electrode directly coupled to the second supply voltage, wherein the fourth transistor and the fifth transistor are respectively turned on or off according to the control signal and the gate driving signal is generated according to the clock signal and the second supply voltage.

7. The gate driver circuit as claimed in claim 6, wherein the gate driver circuit is comprised in a display panel, and the display panel further comprises:

the pixel array; and a controller chip, for generating the clock signal, the first reset signal and the vertical start pulse.

8. The gate driver circuit as claimed in claim 7, wherein the display panel is comprised in an electronic device, and the electronic device comprises:

an input device, receiving signals to control the display panel to display images.

9. The gate driver circuit as claimed in claim 8, wherein the electronic device is a mobile phone, a digital camera, a personal digital assistant (PDA), a lap-top computer, a personal computer, a television, a vehicle displayer, or a portable DVD player.

10. The gate driver circuit as claimed in claim 6, wherein the reset circuit resets the control signal during a first time period according to the first reset signal and the second supply voltage, and resets the control signal during a second time period according to the second reset signal and the second supply voltage.

* * * * *